United States Patent
Pagaila

(10) Patent No.: US 8,482,115 B2
(45) Date of Patent: Jul. 9, 2013

(54) INTEGRATED CIRCUIT PACKAGING SYSTEM WITH DUAL SIDE CONNECTION AND METHOD OF MANUFACTURE THEREOF

(75) Inventor: Reza Argenty Pagaila, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 162 days.

(21) Appl. No.: 12/789,203

(22) Filed: May 27, 2010

(65) Prior Publication Data

US 2011/0291257 A1    Dec. 1, 2011

(51) Int. Cl.
*H01L 23/48* (2006.01)

(52) U.S. Cl.
USPC ............................ 257/693; 257/698

(58) Field of Classification Search
USPC ........... 257/693, 698, 774, E23.011, E23.124
See application file for complete search history.

(56) References Cited

U.S. PATENT DOCUMENTS

| | | |
|---|---|---|
| 7,361,533 B1 | 4/2008 | Huemoeller et al. |
| 7,535,086 B2 | 5/2009 | Merilo et al. |
| 7,548,430 B1 | 6/2009 | Huemoeller et al. |
| 2006/0275952 A1 | 12/2006 | Gowda et al. |
| 2008/0017973 A1* | 1/2008 | Imoto et al. ............... 257/700 |
| 2008/0203557 A1 | 8/2008 | Yamamoto et al. |
| 2009/0050994 A1 | 2/2009 | Ishihara et al. |
| 2009/0057903 A1 | 3/2009 | Okayama et al. |
| 2009/0212408 A1 | 8/2009 | Choi et al. |
| 2009/0224381 A1 | 9/2009 | Ishihara et al. |
| 2010/0033941 A1 | 2/2010 | Pagaila et al. |
| 2010/0127361 A1 | 5/2010 | Kuan et al. |

OTHER PUBLICATIONS

Mayuko Uno, 3-D Package-on-package:Lower; Better Stackability, Nikkei Electronics Asia—Asia Edition—Sep. 2008, Aug. 26, 2008, p. 41, Nikkei Electronics Asia, Tokyo, Japan http://techon.nikkeibp.co.jp/article/HONSHI/20080826/156955.
Ishihara et al., A Dual Face Package Using a Post with Wire Component: Novel Structure for PoP, Water Level CSP and Compact Image Sensor Packages, 2008 Electronic Components and Technology Conference, 2008, p. 1093-1098, Kyushu Institute of Technology, Kitakyushu-city, Japan.
U.S. Appl. No. 12/412,312, filed Mar. 26, 2009, Pagaila et al.
U.S. Appl. No. 12/488,555, filed Jun. 20, 2009, Camacho et al.

* cited by examiner

*Primary Examiner* — Tran Tran
(74) *Attorney, Agent, or Firm* — Ishimaru & Associates LLP; I-Chang John Yang

(57) ABSTRACT

A method of manufacture of an integrated circuit packaging system includes: mounting an integrated circuit over a package carrier; pressing an encapsulation onto the package carrier and with the integrated circuit therein; mounting a conductive frame, having a vertical pillar integral with a horizontal cover, through the encapsulation, over the integrated circuit, and the vertical pillar on the package carrier and the horizontal cover on the encapsulation; and forming a contact from the horizontal cover.

7 Claims, 9 Drawing Sheets

INTEGRATED CIRCUIT PACKAGING SYSTEM WITH DUAL SIDE CONNECTION AND METHOD OF MANUFACTURE THEREOF

TECHNICAL FIELD

The present invention relates generally to an integrated circuit packaging system, and more particularly to a system for an integrated circuit packaging system with dual side connection.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for performance, integration, and cost reduction.

Thus, a need still remains for an integrated circuit packaging system providing improved chip interconnection and space savings. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: mounting an integrated circuit over a package carrier; pressing an encapsulation onto the package carrier and with the integrated circuit therein; mounting a conductive frame, having a vertical pillar integral with a horizontal cover, through the encapsulation, over the integrated circuit, and the vertical pillar on the package carrier and the horizontal cover on the encapsulation; and forming a contact from the horizontal cover.

The present invention provides an integrated circuit packaging system, including: a package carrier; an integrated circuit over the package carrier; an encapsulation onto the package carrier and with the integrated circuit therein; and a support terminal, having a vertical pillar integral with a contact, the vertical pillar through the encapsulation and on the package carrier and the contact on the encapsulation and over the integrated circuit, the contact having a characteristic of being formed with the encapsulation and a conductive frame thereover being pressed.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
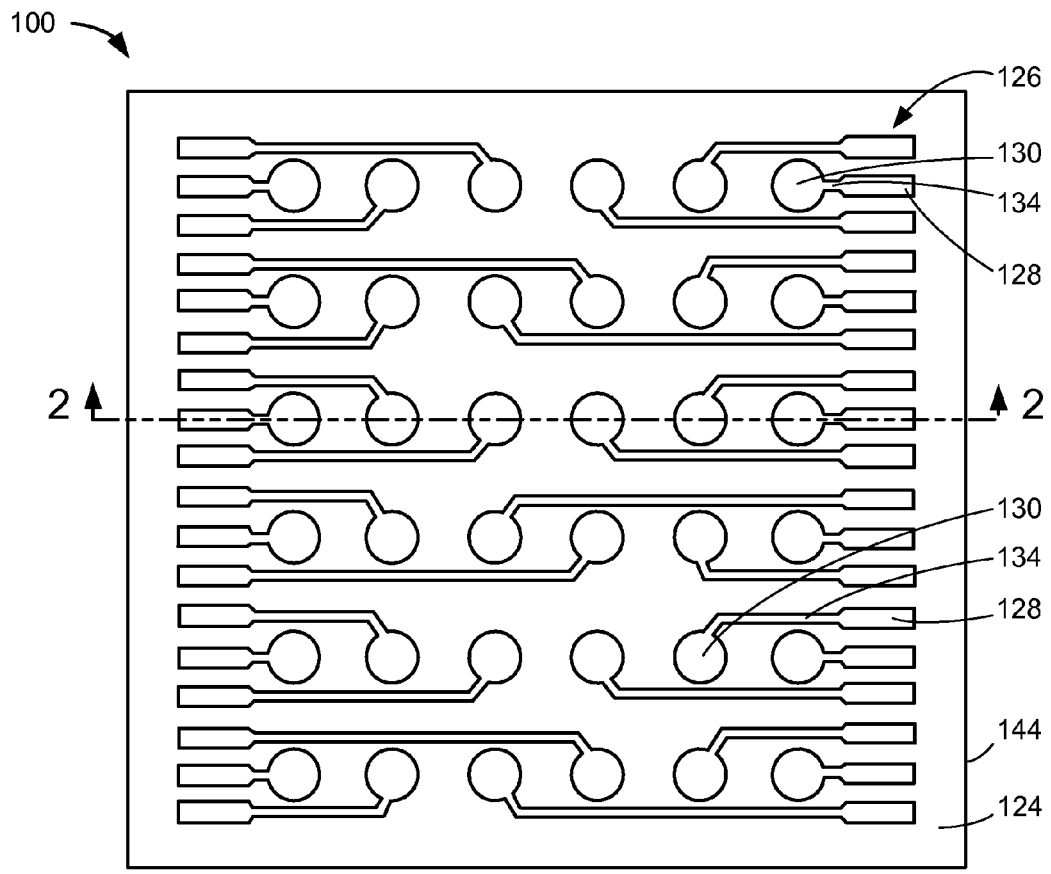
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can have a configuration of a packaging system, which can include a dual-faced package-on-package (PoP) system with etched frames and vertical interconnects (also known as z-interconnects).

The integrated circuit packaging system 100 can include an encapsulation 124, defined as a cover of a semiconductor package that seals electrical components and provides mechanical and environmental protection. The integrated circuit packaging system 100 can include a support terminal 126, defined as an interconnect having a conductive structure that provides physical support and electrical connectivity to external systems (not shown).

The support terminal 126 can include a lead 128, defined as a portion of the support terminal 126 that provides electrical connectivity to external systems. The lead 128 can be more specifically a bond finger, a lead finger, or a contact pad.

For illustrative purposes, the lead 128 is shown with a rectangular shape, although the lead 128 can be formed in different shapes. For example, the lead 128 can have a shape of a square, a triangle, a polygon, a parallelogram, or a rhombus.

The support terminal 126 can include a contact 130, defined as a portion of the support terminal 126 that provides mounting support and electrical connectivity to external systems. For example, the contact 130 can be a lead, a contact pad, or an electrical contact. Also for example, the contact 130 can be a redistributed lead.

The contact 130 can be formed in an area array adjacent to and between a number of the lead 128. The contact 130 can be connected to the lead 128.

For illustrative purposes, the contact 130 is shown in a full area array, although the contact 130 can be formed in a different configuration. For example, the contact 130 can be formed in a peripheral array adjacent to the lead 128.

Also for illustrative purposes, the contact 130 is shown with a circular shape, although the contact 130 can be formed in different shapes. For example, the contact 130 can have a shape of a square, a rectangle, a triangle, a polygon, a parallelogram, or a rhombus.

The support terminal 126 can include a trace 134, defined as an electrical connection between the lead 128 and the contact 130. For example, the trace 134 can be a signal trace or a wire.

The trace 134 can be formed in different configurations. For example, the trace 134 can be formed with different lengths. A length of the trace 134 can be predetermined based on locations of the lead 128 and the contact 130, a distance between the lead 128 and the contact 130, a routing area that is used to form the trace 134, or a combination thereof.

The lead 128 can be formed in a row. For illustrative purposes, the lead 128 is shown in two rows along non-horizontal sides 144 of the encapsulation 124, although the lead 128 can be formed in a different configuration. For example, the lead 128 can be formed in four rows along the non-horizontal sides 144.

The lead 128 can be formed at a distance from the non-horizontal sides 144. The lead 128 can be formed with a side at the distance from the non-horizontal sides 144 and an opposite side connected to the trace 134.

Figure 2:
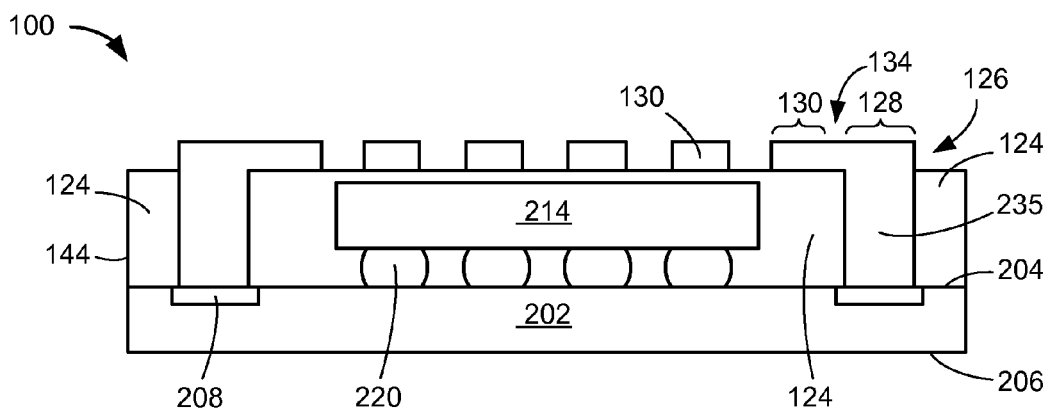
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The integrated circuit packaging system 100 can include a package carrier 202. The package carrier 202 is for mounting and connecting devices and integrated circuits as part of a finished product to be used in a system.

The package carrier 202 can be more specifically a substrate. For example, the package carrier 202 can be as a laminated substrate or a ceramic substrate.

The package carrier 202 can have a first side 204 and a second side 206 opposite to the first side 204. The package carrier 202 can include a carrier pad 208, more specifically a contact pad, a lead, or an electrical contact, at the first side 204.

An integrated circuit 214, more specifically a flip-chip, an integrated circuit die, a semiconductor device, or a chip, can be mounted over the first side 204. An internal interconnect 220, more specifically a ball, a bump, or an electrical connector, can be electrically connected to the first side 204 and the integrated circuit 214. The internal interconnect 220 can be formed with solder, a metallic alloy, or a conductive material.

The encapsulation 124 can be formed over the first side 204 covering the integrated circuit 214 and the internal interconnect 220. The support terminal 126 can include the lead 128, the contact 130, and the trace 134. The contact 130 can be on the encapsulation 124 and over the integrated circuit 214.

The support terminal 126 can include a vertical pillar 235, defined as a conductive portion that provides electrical connectivity between horizontal planes of the integrated circuit packaging system 100. The vertical pillar 235 can be connected to the lead 128.

The vertical pillar 235 can be integral with the lead 128, the contact 130, and the trace 134. In other words, the vertical pillar 235, the lead 128, the contact 130, and the trace 134 can be formed of a common material having characteristics being formed from a single integrated structure or a solid structure.

The vertical pillar 235 can be mounted through the encapsulation 124. The vertical pillar 235 can be mounted on the carrier pad 208. The vertical pillar 235 can be formed with a vertical structure, which is perpendicularly to the contact 130 and the trace 134.

The vertical pillar 235 can be adjacent to the non-horizontal sides 144 of the encapsulation 124. The vertical pillar 235 can be at the distance from the non-horizontal sides 144. The vertical pillar 235 can be encapsulated or covered by the encapsulation 124.

Figure 3:
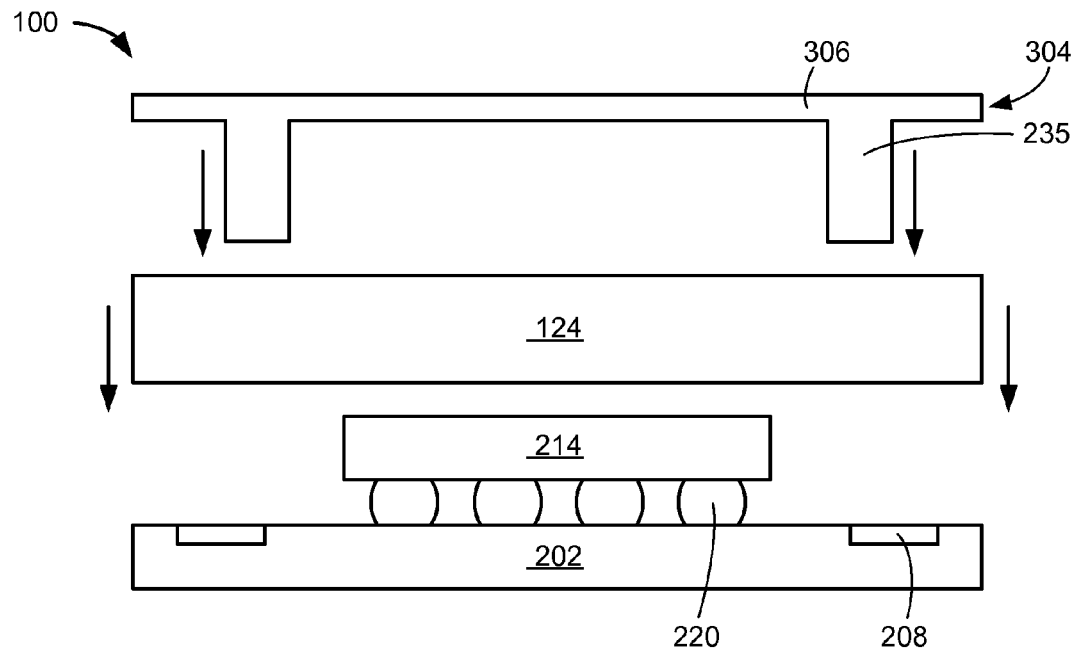
FIG. 3 is a cross-sectional view of the integrated circuit packaging system in a pressing phase of manufacture.

Referring now to FIG. 3, therein is shown a cross-sectional view of the integrated circuit packaging system 100 in a pressing phase of manufacture. The integrated circuit packaging system 100 can include the package carrier 202 and the integrated circuit 214 attached thereto with the internal interconnect 220.

For illustrative purposes, the integrated circuit packaging system 100 is shown with the integrated circuit 214 mounted over the package carrier 202, although there can be any number and any type of components. For example, the integrated circuit packaging system 100 can include an active device and a passive device mounted over the package carrier 202.

The integrated circuit packaging system 100 can include the encapsulation 124 in a manufacturing step. The encapsulation 124 can be formed with a penetrable encapsulant, defined as a material having characteristics of being curable, flowable, and thermally conductive. The penetrable encapsulant can be more specifically a penetrable film adhesive, a B-stage wire in film (WIF) adhesive, a viscous gel, or any other penetrable encapsulation material.

A conductive frame 304 is defined as a structure that provides physical support and electrical connectivity. The conductive frame 304 can be formed with a metal, a metallic alloy, or a conductor. For example, the conductive frame 304 can be formed with a roller copper sheet or a leadframe.

The conductive frame 304 can include the vertical pillar 235 and a horizontal cover 306, defined as a solid layer of a conductive material that provides protection and support for mounting external systems. For example, the horizontal cover 306 can include a material that can be etched or patterned in subsequent process steps. The vertical pillar 235 can be perpendicularly connected to the horizontal cover 306.

The conductive frame 304 can be formed with the vertical pillar 235 integral with the horizontal cover 306. In other words, the conductive frame 304 can be formed with the vertical pillar 235 and the horizontal cover 306 as a single integrated structure or a solid structure.

As shown with arrows, the encapsulation 124 and the conductive frame 304 thereover can be formed by a pressing method. The pressing method refers to a method that uses heat and applies a pressure to mount the conductive frame 304 and form the encapsulation 124. The pressing method can exclude an injection molding method.

The pressing method can be used to apply a downward pressure to the conductive frame 304 and the encapsulation 124 such that the encapsulation 124 is forced onto the package carrier 202. For example, the pressing method can include a heat-pressing process, thermocompression, or any other encapsulation processes that include heat and pressure.

The pressing method can force the vertical pillar 235 through the encapsulation 124 and on the package carrier 202. The horizontal cover 306 can be on the encapsulation 124 and over the integrated circuit 214.

The encapsulation 124 can be pressed onto the package carrier 202 and with the integrated circuit 214 therein. The pressing method can allow the encapsulation 124 to flow and fill a space between the package carrier 202 and the conductive frame 304, covering the integrated circuit 214 and the internal interconnect 220.

As an example, the pressing method can be performed at a temperature of approximately 200 degrees Celsius (° C.). As another example, the pressing method can be performed with a pressure of approximately 5 megapascals (MPa).

Contamination can be avoided when connecting or joining the vertical pillar 235 to the carrier pad 208 with the encapsulation 124 between the package carrier 202 and the vertical pillar 235. For example, contamination can be avoided by the vertical pillar 235 having a flat bottom surface and the carrier pad 208 having a flat top surface, cleaning (e.g. by plasma) the vertical pillar 235 and the carrier pad 208 prior to joining, or a joining process performed in clean environment (e.g. vacuum chamber).

Prior to mounting the conductive frame 304, an attach layer (not shown), more specifically an adhesive paste, an epoxy, or an adhesive, can be deposited on the carrier pad 208. With the conductive frame 304 mounted, the vertical pillar 235 can be connected to the carrier pad 208 with the attach layer.

Figure 4:
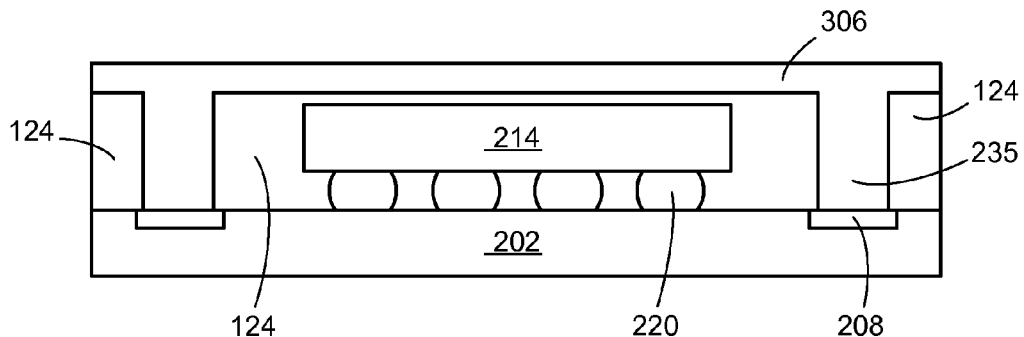
FIG. 4 is the structure of FIG. 3 in a curing phase.

Referring now to FIG. 4, therein is shown the structure of FIG. 3 in a curing phase. With the horizontal cover 306 on the encapsulation 124 and the vertical pillar 235 connected to the carrier pad 208, the encapsulation 124 can be further processed with a curing method.

The curing method can include a process that solidifies or hardens the encapsulation 124. With the encapsulation 124 cured, the integrated circuit 214 and the internal interconnect 220 can be encapsulated and protected. Curing of the encapsulation 124 can also strengthen the attachment between the integrated circuit 214 and the package carrier 202 as well as the attachment or bonding between the vertical pillar 235 and the carrier pad 208.

Figure 5:
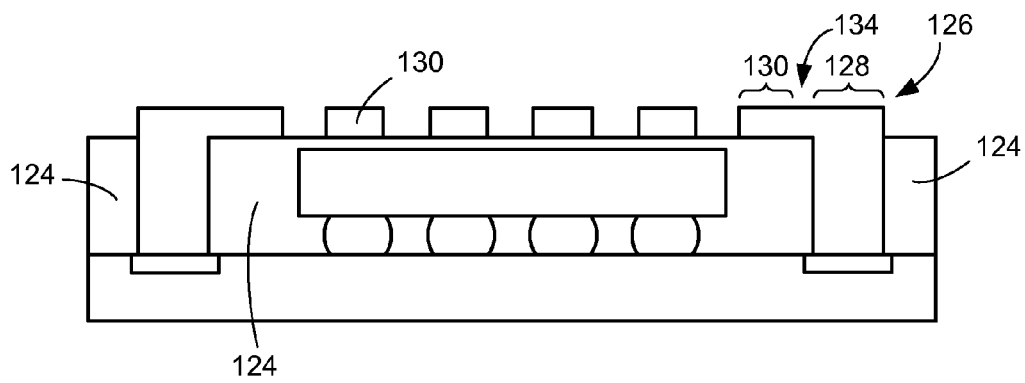
FIG. 5 is the structure of FIG. 4 in a patterning phase.

Referring now to FIG. 5, therein is shown the structure of FIG. 4 in a patterning phase. The support terminal 126 can be formed from the horizontal cover 306 of FIG. 3. More specifically, a patterning process can be used to form the lead 128, the contact 130, and the trace 134 from the horizontal cover 306.

The patterning process can include lithography, etching methods, or any other removal processes. For example, the patterning process can include etching, stamping, cutting, chemical milling, or any combination thereof.

Following the patterning process, back-end processes can be performed. For example, the back-end processes can include marking and singulation.

After the patterning process, the lead 128, the contact 130, and the trace 134 can be formed. The encapsulation 124, the lead 128, the contact 130, and the trace 134 can be formed with a characteristic of being formed with the encapsulation 124 and the conductive frame 304 of FIG. 3 thereover being pressed in the pressing phase as previously described.

The lead 128, the contact 130, and the trace 134 do not have dents or marks characteristic from a mold chase downward force normally found during an injection molding process. The lead 128, the contact 130, and the trace 134 are completely over the encapsulation 124 and not within the encapsulation 124.

The encapsulation 124 can have removal characteristics resulting from the patterning process of forming the lead 128, the contact 130, and the trace 134 from the horizontal cover 306. For example, the removal characteristics can include an etched surface, chemical residue, or a chemically processed surface.

It has been discovered that the integrated circuit packaging system 100 improves reliability. The support terminal 126 is formed from the conductive frame 304, having the vertical pillar 235 integral with the horizontal cover 306. With the encapsulation 124 and the support terminal 126 pressed thereon, a robust structure is provided to reliably mount external systems thereover, thereby improving the reliability.

It has also been discovered that the integrated circuit packaging system 100 provides an interconnection structure with reduced resistance. The support terminal 126, having the vertical pillar 235 integrated with the lead 128, the contact 130, and the trace 134, provides the interconnection structure with the resistance reduced.

Figure 6:
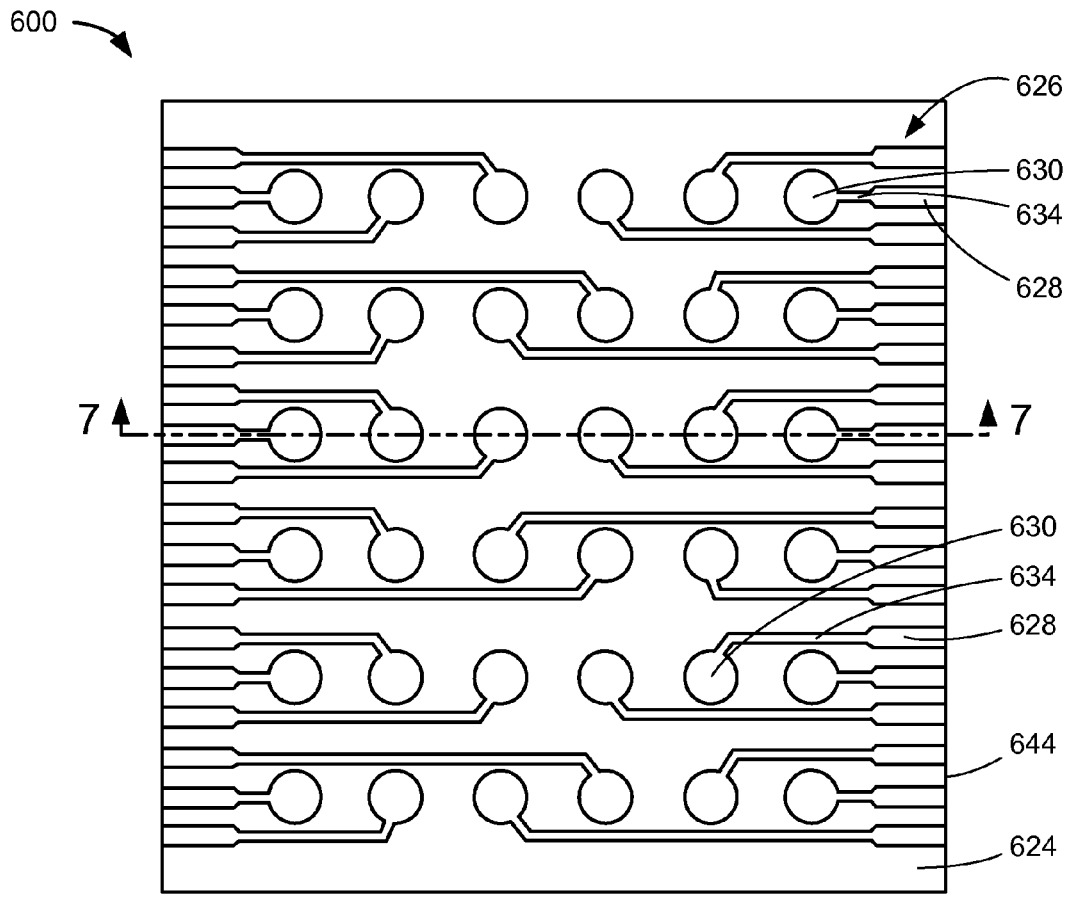
FIG. 6 is a top view of an integrated circuit packaging system in a second embodiment of the present invention.

Referring now to FIG. 6, therein is shown a top view of an integrated circuit packaging system 600 in a second embodiment of the present invention. The integrated circuit packaging system 600 can include an encapsulation 624, defined as a cover of a semiconductor package that seals electrical components and provides mechanical and environmental protection.

The integrated circuit packaging system 600 can include a support terminal 626, defined as an interconnect having a conductive structure that provides physical support and electrical connectivity to external systems (not shown). The support terminal 626 can include a lead 628, defined as a portion of the support terminal 626 that provides electrical connectivity to external systems.

For illustrative purposes, the lead 628 is shown with a rectangular shape, although the lead 628 can be formed in different shapes. For example, the lead 628 can have a shape of a square, a triangle, a polygon, a parallelogram, or a rhombus.

The support terminal 626 can include a contact 630, defined as a portion of the support terminal 626 that provides mounting support and electrical connectivity to external systems. For example, the contact 630 can be a lead, a contact pad, or an electrical contact. Also for example, the contact 630 can be a redistributed lead.

The contact 630 can be formed in an area array adjacent to and between a number of the lead 628. The contact 630 can be connected to the lead 628.

For illustrative purposes, the contact 630 is shown in a full area array, although the contact 630 can be formed in a different configuration. For example, the contact 630 can be formed in a peripheral array adjacent to the lead 628.

Also for illustrative purposes, the contact 630 is shown with a circular shape, although the contact 630 can be formed in different shapes. For example, the contact 630 can have a shape of a square, a rectangle, a triangle, a polygon, a parallelogram, or a rhombus.

The support terminal 626 can include a trace 634, defined as an electrical connection between the lead 628 and the contact 630. For example, the trace 634 can be a signal trace or a wire.

The trace 634 can be formed in different configurations. For example, the trace 634 can be formed with different lengths. A length of the trace 634 can be predetermined based on locations of the lead 628 and the contact 630, a distance between the lead 628 and the contact 630, a routing area that is used to form the trace 634, or a combination thereof.

The lead 628 can be formed in a row. For illustrative purposes, the lead 628 is shown in two rows along non-horizontal sides 644 of the encapsulation 624, although the lead 628 can be formed in a different configuration. For example, the lead 628 can be formed in four rows along the non-horizontal sides 644.

The lead 628 can be formed at the non-horizontal sides 644. The lead 628 can be formed with a side at the non-horizontal sides 644 and an opposite side connected to the trace 634.

Figure 7:
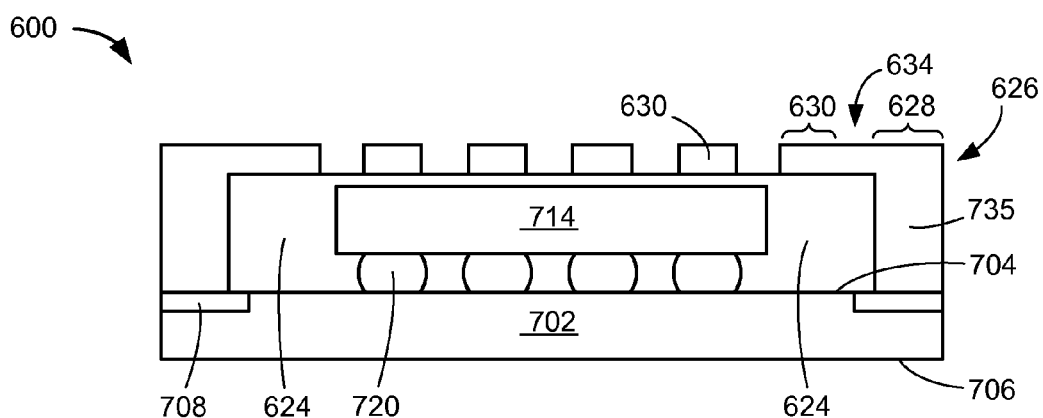
FIG. 7 is a cross-sectional view of the integrated circuit packaging system along a section line 7-7 of FIG. 6.

Referring now to FIG. 7, therein is shown a cross-sectional view of the integrated circuit packaging system 600 along a section line 7-7 of FIG. 6. The integrated circuit packaging system 600 can include a package carrier 702. The package carrier 702 is for mounting and connecting devices and integrated circuits as part of a finished product to be used in a system.

The package carrier 702 can be more specifically a substrate. For example, the package carrier 702 can be as a laminated substrate or a ceramic substrate.

The package carrier 702 can have a first side 704 and a second side 706 opposite to the first side 704. The package carrier 702 can include a carrier pad 708, more specifically a contact pad, a lead, or an electrical contact, at the first side 704.

An integrated circuit 714, more specifically a flip-chip, an integrated circuit die, a semiconductor device, or a chip, can be mounted over the first side 704. An internal interconnect 720, more specifically a ball, a bump, or an electrical connector, can be electrically connected to the first side 704 and the integrated circuit 714. The internal interconnect 720 can be formed with solder, a metallic alloy, or a conductive material.

The encapsulation 624 can be formed over the first side 704 covering the integrated circuit 714 and the internal interconnect 720. The support terminal 626 can include the lead 628, the contact 630, and the trace 634. The contact 630 can be on the encapsulation 624 and over the integrated circuit 714.

The support terminal 626 can include a vertical pillar 335, defined as a conductive portion that provides electrical connectivity between horizontal planes of the integrated circuit packaging system 600. The vertical pillar 335 can be connected to the lead 628.

The vertical pillar 335 can be integral with the lead 628, the contact 630, and the trace 634. In other words, the vertical pillar 335, the lead 628, the contact 630, and the trace 634 can be formed of a common material having characteristics being formed from a single integrated structure or a solid structure.

The vertical pillar 335 can be mounted through the encapsulation 624. The vertical pillar 335 can be mounted on the carrier pad 708. The vertical pillar 335 can be formed with a vertical structure, which is perpendicularly to the contact 630 and the trace 634.

The vertical pillar 335 can be at the non-horizontal sides 644 of FIG. 6. The vertical pillar 335 can be partially exposed from the encapsulation 624 at the non-horizontal sides 644. With exposed sides, the vertical pillar 335 can be useful for socket connections.

Figure 8:
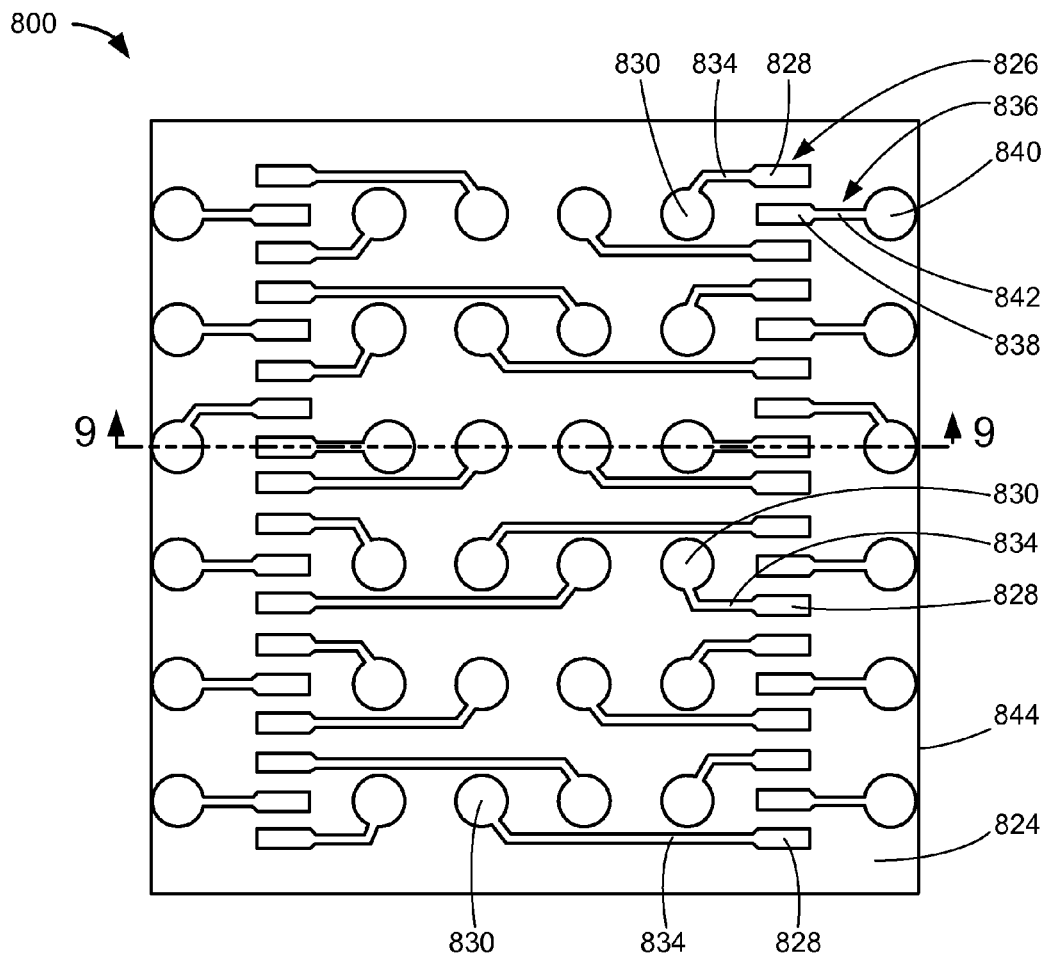
FIG. 8 is a top view of an integrated circuit packaging system in a third embodiment of the present invention.

Referring now to FIG. 8, therein is shown a top view of an integrated circuit packaging system 800 in a third embodiment of the present invention. The integrated circuit packaging system 800 can include an encapsulation 824, defined as a cover of a semiconductor package that seals electrical components and provides mechanical and environmental protection.

The integrated circuit packaging system 800 can include a support terminal 826, defined as an interconnect having a conductive structure that provides physical support and electrical connectivity to external systems (not shown). The support terminal 826 can include a lead 828, defined as a portion of the support terminal 826 that provides electrical connectivity to external systems.

The support terminal 826 can include a contact 830, defined as a portion of the support terminal 826 that provides mounting support and electrical connectivity to external systems. The contact 830 can be connected to the lead 828.

For example, the contact 830 can be a lead, a contact pad, or an electrical contact. Also for example, the contact 830 can be a redistributed lead.

The support terminal 826 can include a trace 834, defined as an electrical connection between the lead 828 and the contact 830. For example, the trace 834 can be a signal trace or a wire.

The trace 834 can be formed in different configurations. For example, the trace 834 can be formed with different lengths. A length of the trace 834 can be predetermined based on locations of the lead 828 and the contact 830, a distance between the lead 828 and the contact 830, a routing area that is used to form the trace 834, or a combination thereof.

The integrated circuit packaging system 800 can include an additional support terminal 836, defined as an interconnect having a conductive structure that provides physical support and electrical connectivity to external systems (not shown). The additional support terminal 836 can include an additional lead 838, defined as a portion of the additional support terminal 836 that provides electrical connectivity to external systems.

The additional support terminal 836 can include an additional contact 840, defined as a portion of the additional support terminal 836 that provides mounting support and electrical connectivity to external systems. The additional contact 840 can be connected to the additional lead 838.

For example, the additional contact 840 can be a lead, a contact pad, or an electrical contact. Also for example, the additional contact 840 can be a fan-out interconnect or a redistributed lead.

The additional support terminal 836 can include an additional trace 842, defined as an electrical connection between the additional lead 838 and the additional contact 840. For example, the additional trace 842 can be a signal trace or a wire.

The additional trace 842 can be formed in different configurations. For example, the additional trace 842 can be formed with different lengths. A length of the additional trace 842 can be predetermined based on locations of the additional lead 838 and the additional contact 840, a distance between the additional lead 838 and the additional contact 840, a routing area that is used to form the additional trace 842, or a combination thereof.

The lead 828 and the additional lead 838 can be formed in a row. For illustrative purposes, the lead 828 and the additional lead 838 are shown in two rows along non-horizontal sides 844 of the encapsulation 824, although the lead 828 and the additional lead 838 can be formed in a different configuration. For example, the lead 828 and the additional lead 838 can be formed in four rows along the non-horizontal sides 844.

The lead 828 and the additional lead 838 can be formed at a distance from the non-horizontal sides 844. The lead 828 can be formed with a side at the distance from the non-horizontal sides 844 and an opposite side connected to the trace 834. The additional lead 838 can be formed with an additional side at the distance from the non-horizontal sides 844 and an additional opposite side connected to the additional trace 842.

For illustrative purposes, the lead 828 and the additional lead 838 are shown with rectangular shapes, although the lead 828 and the additional lead 838 can be formed in different shapes. For example, the lead 828 and the additional lead 838 can have shapes of a square, a triangle, a polygon, a parallelogram, or a rhombus.

The contact 830 can be formed in an area array adjacent to and between a number of the lead 828 and the additional lead 838. The additional contact 840 can be formed in a row adjacent to the non-horizontal sides 844 and between the non-horizontal sides 844 and a number of the lead 828 and the additional lead 838.

For illustrative purposes, the contact 830 is shown in a full area array, although the contact 830 can be formed in a different configuration. For example, the contact 830 can be formed in a peripheral array adjacent to the lead 828 and the additional lead 838.

Also for illustrative purposes, the additional contact 840 is shown in two rows, although the additional contact 840 can be formed in a different configuration. For example, the additional contact 840 can be formed in a peripheral array adjacent to the non-horizontal sides 844 and between the non-horizontal sides 844 and a number of the lead 828 and the additional lead 838.

Further, for illustrative purposes, the contact 830 and the additional contact 840 are shown with circular shapes, although the contact 830 and the additional contact 840 can be formed in different shapes. For example, the contact 830 and the additional contact 840 can have shapes of a square, a rectangle, a triangle, a polygon, a parallelogram, or a rhombus.

Figure 9:
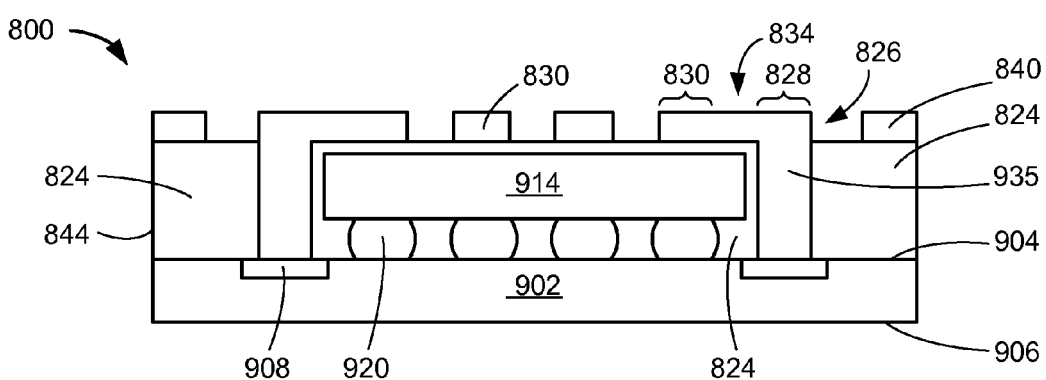
FIG. 9 is a cross-sectional view of the integrated circuit packaging system along a section line 9-9 of FIG. 8.

Referring now to FIG. 9, therein is shown a cross-sectional view of the integrated circuit packaging system 800 along a section line 9-9 of FIG. 8. The integrated circuit packaging system 800 can include a package carrier 902. The package carrier 902 is for mounting and connecting devices and integrated circuits as part of a finished product to be used in a system.

The package carrier 902 can be more specifically a substrate. For example, the package carrier 902 can be as a laminated substrate or a ceramic substrate. Also for example, the package carrier 902 can be a recessed substrate.

The package carrier 902 can have a first side 904 and a second side 906 opposite to the first side 904. The package carrier 902 can include a carrier pad 908, more specifically a contact pad, a lead, or an electrical contact, at the first side 904.

An integrated circuit 914, more specifically a flip-chip, an integrated circuit die, a semiconductor device, or a chip, can be mounted over the first side 904. An internal interconnect 920, more specifically a ball, a bump, or an electrical connector, can be electrically connected to the first side 904 and the integrated circuit 914. The internal interconnect 920 can be formed with solder, a metallic alloy, or a conductive material.

The encapsulation 824 can be formed over the first side 904 covering the integrated circuit 914 and the internal interconnect 920. The support terminal 826 can include the lead 828, the contact 830, and the trace 834. The contact 830 can be on the encapsulation 824 and over the integrated circuit 914.

The support terminal 826 can include a vertical pillar 935, defined as a conductive portion that provides electrical connectivity between horizontal planes of the integrated circuit packaging system 800. The vertical pillar 935 can be connected to the lead 828.

The vertical pillar 935 can be integral with the lead 828, the contact 830, and the trace 834. In other words, the vertical pillar 935, the lead 828, the contact 830, and the trace 834 can be formed of a common material having characteristics being formed from a single integrated structure or a solid structure.

The vertical pillar 935 can be mounted through the encapsulation 824. The vertical pillar 935 can be mounted on the carrier pad 908. The vertical pillar 935 can be formed with a vertical structure, which is perpendicularly to the contact 830 and the trace 834.

The vertical pillar 935 can be adjacent to the non-horizontal sides 844 of the encapsulation 824. The vertical pillar 935 can be at the distance from the non-horizontal sides 844. The vertical pillar 935 can be encapsulated or covered by the encapsulation 824.

The additional contact 840 can be adjacent to the non-horizontal sides 844. The additional contact 840 can be between the non-horizontal sides 844 and the lead 828. The additional contact 840 can be on the encapsulation 824.

Figure 10:
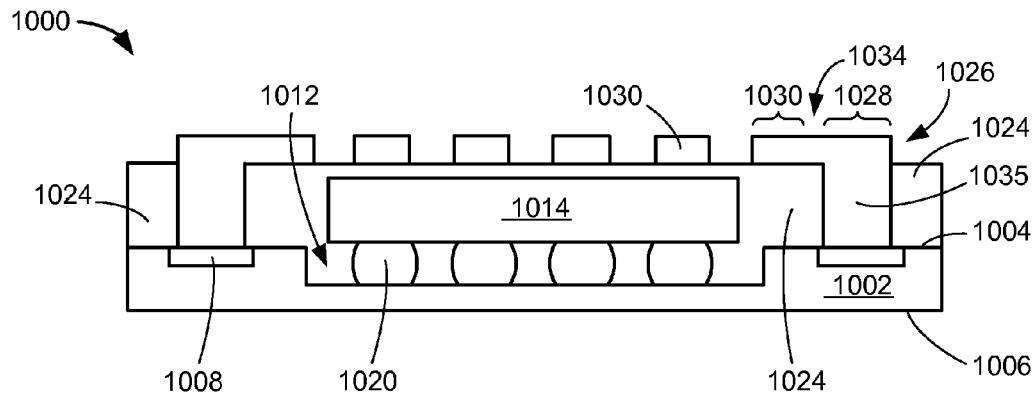
FIG. 10 is a cross-sectional view as exemplified by the top view of FIG. 1 of an integrated circuit packaging system in a fourth embodiment of the present invention.

Referring now to FIG. 10, therein is shown a cross-sectional view as exemplified by the top view of FIG. 1 of an integrated circuit packaging system 1000 in a fourth embodiment of the present invention. The integrated circuit packaging system 1000 can be formed in a manner similar to the integrated circuit packaging system 100 of FIG. 1, except for the formation of the package carrier 202 of FIG. 2.

The integrated circuit packaging system 1000 can include a package carrier 1002, having a first side 1004, a second side 1006, and a carrier pad 1008. The package carrier 1002 can be formed in a manner similar to the package carrier 202, except that the package carrier 1002 can include a recess 1012, defined as a cavity at the first side 1004.

The integrated circuit packaging system 1000 can include an integrated circuit 1014, an internal interconnect 1020, and an encapsulation 1024. The integrated circuit packaging system 1000 can include a support terminal 1026 having a lead 1028, a contact 1030, a trace 1034, and a vertical pillar 1035. The integrated circuit 1014, the internal interconnect 1020, the encapsulation 1024, and the support terminal 1026 can be formed in a manner similar to the integrated circuit 214 of FIG. 2, the internal interconnect 220 of FIG. 2, the encapsulation 124 of FIG. 1, and the support terminal 126 of FIG. 1, respectively.

The integrated circuit 1014 can be mounted within the recess 1012. The internal interconnect 1020 can be electrically connected to the package carrier 1002 and the integrated circuit 1014 within the recess 1012.

Figure 11:
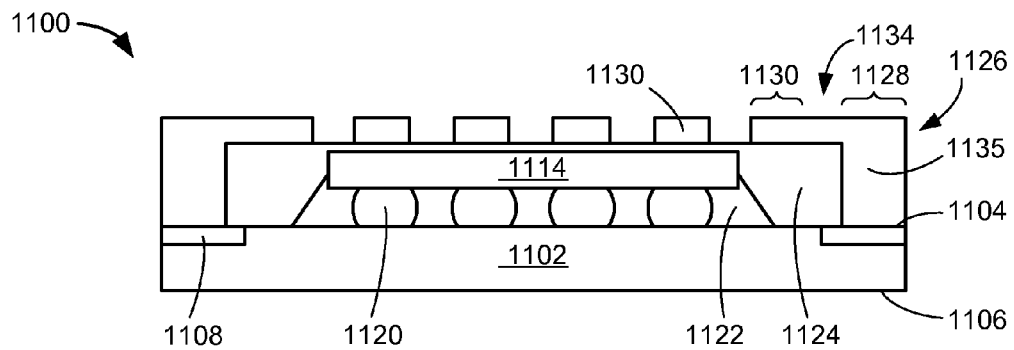
FIG. 11 is a cross-sectional view as exemplified by the top view of FIG. 6 of an integrated circuit packaging system in a fifth embodiment of the present invention.

Referring now to FIG. 11, therein is shown a cross-sectional view as exemplified by the top view of FIG. 6 of an integrated circuit packaging system 1100 in a fifth embodiment of the present invention. The integrated circuit packaging system 1100 can be formed in a manner similar to the integrated circuit packaging system 600 of FIG. 6, except for an addition of an underfill material.

The integrated circuit packaging system 1100 can include a package carrier 1102, having a first side 1104, a second side 1106, and a carrier pad 1108. The integrated circuit packaging system 1100 can include an integrated circuit 1114 and an internal interconnect 1120. The package carrier 1102, the integrated circuit 1114, and the internal interconnect 1120 can be formed in a manner similar to the package carrier 702 of FIG. 7, the integrated circuit 714 of FIG. 7, and the internal interconnect 720 of FIG. 7, respectively.

The integrated circuit packaging system 1100 can include an underfill 1122, more specifically an epoxy resin or any underfill resin material, formed in a space between the package carrier 1102 and the integrated circuit 1114. For example, the underfill 1122 can be formed by a dispensing process.

The underfill 1122 can protect the internal interconnect 1120. After the formation of the underfill 1122, the integrated circuit 1114 can be thinned to have a reduced height.

The integrated circuit packaging system 1100 can include an encapsulation 1124 and a support terminal 1126 having a lead 1128, a contact 1130, a trace 1134, and a vertical pillar 1135. The encapsulation 1124 and the support terminal 1126 can be formed in a manner similar to the encapsulation 624 of FIG. 6 and the support terminal 626 of FIG. 6, respectively. The encapsulation 1124 can cover the underfill 1122.

Figure 12:
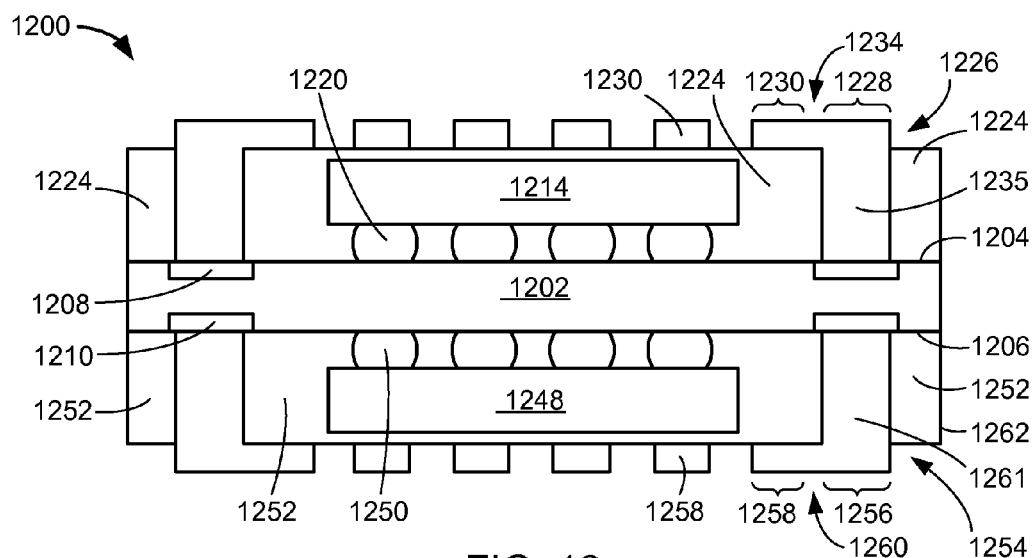
FIG. 12 is a cross-sectional view as exemplified by the top view of FIG. 1 of an integrated circuit packaging system in a sixth embodiment of the present invention.

Referring now to FIG. 12, therein is shown a cross-sectional view as exemplified by the top view of FIG. 1 of an integrated circuit packaging system 1200 in a sixth embodiment of the present invention. The integrated circuit packaging system 1200 can be formed in a manner similar to the integrated circuit packaging system 100 of FIG. 1, except the integrated circuit packaging system 1200 can include a double-sided encapsulation.

The integrated circuit packaging system 1200 can include a package carrier 1202, having a first side 1204, a second side 1206, and a carrier pad 1208. The package carrier 1202 can be formed in a manner similar to the package carrier 202 of FIG. 2, except that the package carrier 1202 can include a second carrier pad 1210, more specifically a contact pad, a lead, or an electrical contact, at the second side 1206.

The integrated circuit packaging system 1200 can include a first integrated circuit 1214 and a first internal interconnect 1220. The first integrated circuit 1214 and the first internal interconnect 1220 can be formed in a manner similar to the integrated circuit 214 of FIG. 2 and the internal interconnect 220 of FIG. 2, respectively.

The integrated circuit packaging system 1200 can include a first encapsulation 1224 and a first support terminal 1226 having a first lead 1228, a first contact 1230, a first trace 1234, and a first vertical pillar 1235. The first encapsulation 1224 and the first support terminal 1226 can be formed in a manner similar to the encapsulation 124 of FIG. 1 and the support terminal 126 of FIG. 1, respectively.

The first support terminal 1226 can be mounted over the first side 1204. The first contact 1230 can be formed from the horizontal cover 306 of FIG. 3.

A second integrated circuit 1248, more specifically a flip-chip, an integrated circuit die, a semiconductor device, or a chip, can be mounted over the second side 1206. A second internal interconnect 1250, more specifically a ball, a bump, or an electrical connector, can be electrically connected to the second side 1206 and the second integrated circuit 1248. The second internal interconnect 1250 can be formed with solder, a metallic alloy, or a conductive material.

The integrated circuit packaging system 1200 can include a second encapsulation 1252, defined as a cover of a semiconductor package that seals electrical components and provides mechanical and environmental protection. The second encapsulation 1252 can be formed over the second side 1206 covering the second integrated circuit 1248 and the second internal interconnect 1250.

The integrated circuit packaging system 1200 can include a second support terminal 1254, defined as an interconnect having a conductive structure that provides physical support and electrical connectivity to external systems (not shown). The second support terminal 1254 can be mounted over the second side 1206 opposite to the first side 1204.

The second support terminal 1254 can include a second lead 1256, defined as a portion of the second support terminal 1254 that provides electrical connectivity to external systems. The second lead 1256 can be more specifically a bond finger, a lead finger, or a contact pad.

The second support terminal 1254 can include a second contact 1258, defined as a portion of the second support terminal 1254 that provides mounting support and electrical connectivity to external systems. For example, the second contact 1258 can be a lead, a contact pad, or an electrical contact. Also for example, the second contact 1258 can be a redistributed lead.

The second contact 1258 can be formed in an area array adjacent to and between a number of the second lead 1256. The second contact 1258 can be connected to the second lead 1256.

The second support terminal 1254 can include a second trace 1260, defined as an electrical connection between the second lead 1256 and the second contact 1258. For example, the second trace 1260 can be a signal trace or a wire.

The second trace 1260 can be formed in different configurations. For example, the second trace 1260 can be formed with different lengths. A length of the second trace 1260 can be predetermined based on locations of the second lead 1256 and the second contact 1258, a distance between the second lead 1256 and the second contact 1258, a routing area that is used to form the second trace 1260, or a combination thereof.

The second lead 1256 can be formed in a row along second non-horizontal sides 1262 of the second encapsulation 1252. The second lead 1256 can be formed at a distance from the second non-horizontal sides 1262. The second lead 1256 can be formed with a side at the distance from the second non-horizontal sides 1262 and an opposite side connected to the second trace 1260.

The second contact 1258 can be on the second encapsulation 1252. The second contact 1258 can be over the second integrated circuit 1248.

The second support terminal 1254 can include a second vertical pillar 1261, defined as a conductive portion that provides electrical connectivity between horizontal planes of the integrated circuit packaging system 1200. The second vertical pillar 1261 can be connected to the second lead 1256.

The second vertical pillar 1261 can be integral with the second lead 1256, the second contact 1258, and the second trace 1260. In other words, the second vertical pillar 1261, the second lead 1256, the second contact 1258, and the second trace 1260 can be formed of a common material having characteristics being formed from a single integrated structure or a solid structure.

The second vertical pillar 1261 can be mounted through the second encapsulation 1252. The second vertical pillar 1261 can be mounted on and connected to the second carrier pad 1210. The second vertical pillar 1261 can be formed with a vertical structure, which is perpendicularly to the second contact 1258 and the second trace 1260.

The second vertical pillar 1261 can be adjacent to the second non-horizontal sides 1262 of the second encapsulation 1252. The second vertical pillar 1261 can be at the distance from the second non-horizontal sides 1262. The second vertical pillar 1261 can be encapsulated or covered by the second encapsulation 1252.

Figure 13:
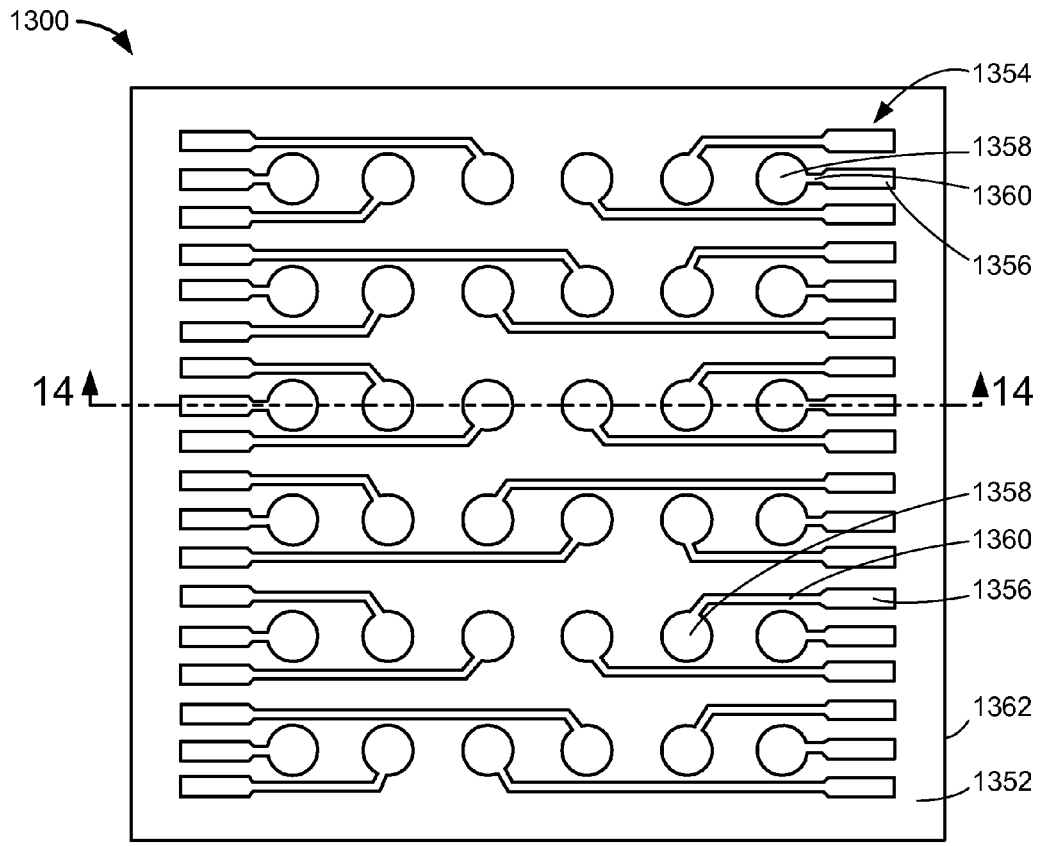
FIG. 13 is a top view of an integrated circuit packaging system in a seventh embodiment of the present invention.

Referring now to FIG. 13, therein is shown a top view of an integrated circuit packaging system 1300 in a seventh embodiment of the present invention. The integrated circuit packaging system 1300 can include a second encapsulation 1352, defined as a cover of a semiconductor package that seals electrical components and provides mechanical and environmental protection. For example, the second encapsulation 1352 can be a multi-level encapsulation.

The integrated circuit packaging system 1300 can include a second support terminal 1354, defined as an interconnect having a conductive structure that provides physical support and electrical connectivity to external systems (not shown). The second support terminal 1354 can include a second lead 1356, defined as a portion of the second support terminal 1354 that provides electrical connectivity to external systems.

For illustrative purposes, the second lead 1356 is shown with a rectangular shape, although the second lead 1356 can be formed in different shapes. For example, the second lead 1356 can have a shape of a square, a triangle, a polygon, a parallelogram, or a rhombus.

The second support terminal 1354 can include a second contact 1358, defined as a portion of the second support terminal 1354 that provides mounting support and electrical connectivity to external systems. For example, the second contact 1358 can be a lead, a contact pad, or an electrical contact. Also for example, the second contact 1358 can be a redistributed lead.

The second contact 1358 can be formed in an area array adjacent to and between a number of the second lead 1356. The second contact 1358 can be connected to the second lead 1356.

For illustrative purposes, the second contact 1358 is shown in a full area array, although the second contact 1358 can be formed in a different configuration. For example, the second contact 1358 can be formed in a peripheral array adjacent to the second lead 1356.

Also for illustrative purposes, the second contact 1358 is shown with a circular shape, although the second contact 1358 can be formed in different shapes. For example, the second contact 1358 can have a shape of a square, a rectangle, a triangle, a polygon, a parallelogram, or a rhombus.

The second support terminal 1354 can include a second trace 1360, defined as an electrical connection between the second lead 1356 and the second contact 1358. For example, the second trace 1360 can be a signal trace or a wire.

The second trace 1360 can be formed in different configurations. For example, the second trace 1360 can be formed with different lengths. A length of the second trace 1360 can be predetermined based on locations of the second lead 1356 and the second contact 1358, a distance between the second lead 1356 and the second contact 1358, a routing area that is used to form the second trace 1360, or a combination thereof.

The second lead 1356 can be formed in a row. For illustrative purposes, the second lead 1356 is shown in two rows along second non-horizontal sides 1362 of the second encapsulation 1352, although the second lead 1356 can be formed in a different configuration. For example, the second lead 1356 can be formed in four rows along the second non-horizontal sides 1362.

The second lead 1356 can be formed at a distance from the second non-horizontal sides 1362. The second lead 1356 can be formed with a side at the distance from the second non-horizontal sides 1362 and an opposite side connected to the second trace 1360.

Figure 14:
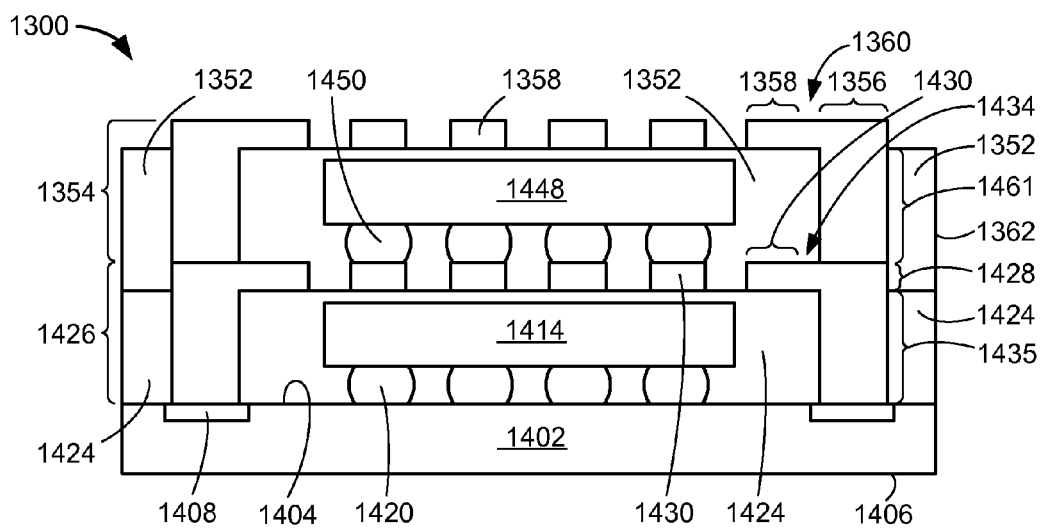
FIG. 14 is a cross-sectional view of the integrated circuit packaging system along a section line 14-14 of FIG. 13.

Referring now to FIG. 14, therein is shown a cross-sectional view of the integrated circuit packaging system 1300 along a section line 14-14 of FIG. 13. The integrated circuit packaging system 1300 can include a package carrier 1402. The package carrier 1402 is for mounting and connecting devices and integrated circuits as part of a finished product to be used in a system.

The package carrier 1402 can be more specifically a substrate. For example, the package carrier 1402 can be as a laminated substrate or a ceramic substrate.

The package carrier 1402 can have a first side 1404 and a second side 1406 opposite to the first side 1404. The package carrier 1402 can include a carrier pad 1408, more specifically a contact pad, a lead, or an electrical contact, at the first side 1404.

A first integrated circuit 1414, more specifically a flip-chip, an integrated circuit die, a semiconductor device, or a chip, can be mounted over the first side 1404. A first internal interconnect 1420, more specifically a ball, a bump, or an electrical connector, can be electrically connected to the first side 1404 and the first integrated circuit 1414. The first internal interconnect 1420 can be formed with solder, a metallic alloy, or a conductive material.

The integrated circuit packaging system 1300 can include a first encapsulation 1424, defined as a cover of a semiconductor package that seals electrical components and provides mechanical and environmental protection. The first encapsulation 1424 can be formed over the first side 1404 covering the first integrated circuit 1414 and the first internal interconnect 1420.

The integrated circuit packaging system 1300 can include a first support terminal 1426, having a first lead 1428, a first contact 1430, a first trace 1434, and a first vertical pillar 1435. The first support terminal 1426 can be formed in a manner similar to the support terminal 126 of FIG. 1. For example, the first contact 1430 can be formed from the horizontal cover 306 of FIG. 3.

A second integrated circuit 1448, more specifically a flip-chip, an integrated circuit die, a semiconductor device, or a chip, can be mounted over the first contact 1430. A second internal interconnect 1450, more specifically a ball, a bump, or an electrical connector, can be electrically connected to the first contact 1430 and the second integrated circuit 1448. The second internal interconnect 1450 can be formed with solder, a metallic alloy, or a conductive material.

The second encapsulation 1352 can be formed over the first support terminal 1426 covering the second integrated circuit 1448 and the second internal interconnect 1450. The second support terminal 1354 can be mounted over the first support terminal 1426 and the second encapsulation 1352.

The second support terminal 1354 can include the second lead 1356, the second contact 1358, and the second trace 1360. The second contact 1358 can be on the second encapsulation 1352 and over the second integrated circuit 1448.

The second support terminal 1354 can include a second vertical pillar 1461, defined as a conductive portion that provides electrical connectivity between horizontal planes of the integrated circuit packaging system 1300. The second vertical pillar 1461 can be connected to the second lead 1356.

The second vertical pillar 1461 can be integral with the second lead 1356, the second contact 1358, and the second trace 1360. In other words, the second vertical pillar 1461, the second lead 1356, the second contact 1358, and the second trace 1360 can be formed of a common material having characteristics being formed from a single integrated structure or a solid structure.

The second vertical pillar 1461 can be mounted through the second encapsulation 1352. The second vertical pillar 1461 can be mounted on the first lead 1428. The second vertical pillar 1461 can be formed with a vertical structure, which is perpendicularly to the second contact 1358 and the second trace 1360.

The first lead 1428 of the first support terminal 1426 can be connected to the second vertical pillar 1461 of the second support terminal 1354 with an attach layer (not shown), more specifically an adhesive paste, an epoxy, solder, or a conductive material. The attach layer can be conductive to electrically connect the first support terminal 1426 and the second support terminal 1354.

Alternatively, the first support terminal 1426 and the second support terminal 1354 can be bonded. For example, the first support terminal 1426 and the second support terminal 1354 can be bonded with thermo-compression bonding by pressing the second support terminal 1354 onto the first support terminal 1426.

The second vertical pillar 1461 can be adjacent to the second non-horizontal sides 1362 of the second encapsulation 1352. The second vertical pillar 1461 can be at the distance from the second non-horizontal sides 1362. The second vertical pillar 1461 can be encapsulated or covered by the second encapsulation 1352.

Figure 15:
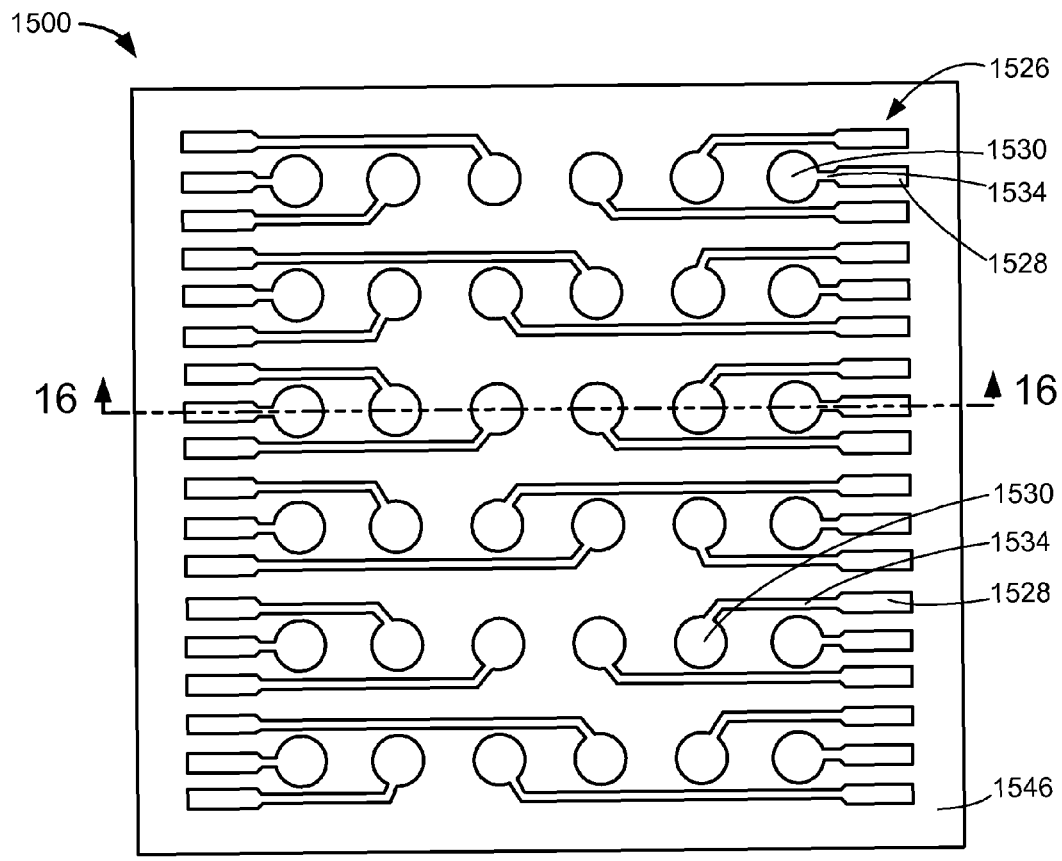
FIG. 15 is a top view of an integrated circuit packaging system in an eighth embodiment of the present invention.

Referring now to FIG. 15, therein is shown a top view of an integrated circuit packaging system 1500 in an eighth embodiment of the present invention. The integrated circuit packaging system 1500 can include a support terminal 1526, defined as an interconnect having a conductive structure that provides physical support and electrical connectivity to external systems (not shown).

The support terminal 1526 can include a lead 1528, defined as a portion of the support terminal 1526 that provides electrical connectivity to external systems. The lead 1528 can be more specifically a bond finger, a lead finger, or a contact pad.

For illustrative purposes, the lead 1528 is shown with a rectangular shape, although the lead 1528 can be formed in different shapes. For example, the lead 1528 can have a shape of a square, a triangle, a polygon, a parallelogram, or a rhombus.

The support terminal 1526 can include a contact 1530, defined as a portion of the support terminal 1526 that provides mounting support and electrical connectivity to external systems. For example, the contact 1530 can be a lead, a contact pad, or an electrical contact. Also for example, the contact 1530 can be a redistributed lead.

The contact 1530 can be formed in an area array adjacent to and between a number of the lead 1528. The contact 1530 can be connected to the lead 1528.

For illustrative purposes, the contact 1530 is shown in a full area array, although the contact 1530 can be formed in a different configuration. For example, the contact 1530 can be formed in a peripheral array adjacent to the lead 1528.

Also for illustrative purposes, the contact 1530 is shown with a circular shape, although the contact 1530 can be formed in different shapes. For example, the contact 1530 can have a shape of a square, a rectangle, a triangle, a polygon, a parallelogram, or a rhombus.

The support terminal 1526 can include a trace 1534, defined as an electrical connection between the lead 1528 and the contact 1530. For example, the trace 1534 can be a signal trace or a wire.

The trace 1534 can be formed in different configurations. For example, the trace 1534 can be formed with different lengths. A length of the trace 1534 can be predetermined based on locations of the lead 1528 and the contact 1530, a distance between the lead 1528 and the contact 1530, a routing area that is used to form the trace 1534, or a combination thereof.

The integrated circuit packaging system 1500 can include a resist material 1546, which provides electrical insulation and protection. The resist material 1546 can be applied adjacent to the support terminal 1526. For example, the resist material 1546 can be applied with a patterning process, a deposition of materials, or any other processing method.

For example, the resist material 1546 can provide an electrical insulation to prevent solder from causing small bridges. Also for example, the resist material 1546 can include a solder resist, polyimide (PI), an epoxy resin, or any insulator.

Figure 16:
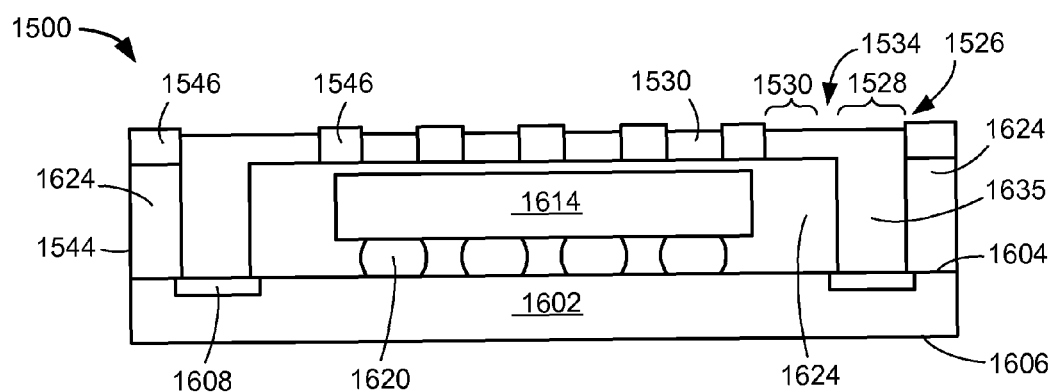
FIG. 16 is a cross-sectional view of the integrated circuit packaging system along a section line 16-16 of FIG. 15.

Referring now to FIG. 16, therein is shown a cross-sectional view of the integrated circuit packaging system 1500 along a section line 16-16 of FIG. 15. The integrated circuit packaging system 1500 can include a package carrier 1602. The package carrier 1602 is for mounting and connecting devices and integrated circuits as part of a finished product to be used in a system.

The package carrier 1602 can be more specifically a substrate. For example, the package carrier 1602 can be as a laminated substrate or a ceramic substrate.

The package carrier 1602 can have a first side 1604 and a second side 1606 opposite to the first side 1604. The package carrier 1602 can include a carrier pad 1608, more specifically a contact pad, a lead, or an electrical contact, at the first side 1604.

An integrated circuit 1614, more specifically a flip-chip, an integrated circuit die, a semiconductor device, or a chip, can be mounted over the first side 1604. An internal interconnect 1620, more specifically a ball, a bump, or an electrical connector, can be electrically connected to the first side 1604 and the integrated circuit 1614. The internal interconnect 1620 can be formed with solder, a metallic alloy, or a conductive material.

The integrated circuit packaging system 1500 can include an encapsulation 1624, defined as a cover of a semiconductor package that seals electrical components and provides mechanical and environmental protection. The encapsulation 1624 can be formed over the first side 1604 covering the integrated circuit 1614 and the internal interconnect 1620.

The support terminal 1526 can include the lead 1528, the contact 1530, and the trace 1534. The contact 1530 can be on the encapsulation 1624 and over the integrated circuit 1614.

The support terminal 1526 can include a vertical pillar 1635, defined as a conductive portion that provides electrical connectivity between horizontal planes of the integrated circuit packaging system 1500. The vertical pillar 1635 can be connected to the lead 1528.

The vertical pillar 1635 can be integral with the lead 1528, the contact 1530, and the trace 1534. In other words, the vertical pillar 1635, the lead 1528, the contact 1530, and the trace 1534 can be formed of a common material having characteristics being formed from a single integrated structure or a solid structure.

The vertical pillar 1635 can be mounted through the encapsulation 1624. The vertical pillar 1635 can be mounted on the carrier pad 1608. The vertical pillar 1635 can be formed with a vertical structure, which is perpendicularly to the contact 1530 and the trace 1534.

The lead 1528 can be formed in a row along non-horizontal sides 1544 of the encapsulation 1624. The lead 1528 can be formed at a distance from the non-horizontal sides 1544. The lead 1528 can be formed with a side at the distance from the non-horizontal sides 1544 and an opposite side connected to the trace 1534.

The vertical pillar 1635 can be adjacent to the non-horizontal sides 1544 of the encapsulation 1624. The vertical pillar 1635 can be at the distance from the non-horizontal sides 1544. The vertical pillar 1635 can be encapsulated or covered by the encapsulation 1624.

The resist material 1546 can be applied over the encapsulation 1624. The resist material 1546 can be applied to cover a portion of the encapsulation 1624. The resist material 1546 can be applied adjacent to the support terminal 1526, including the lead 1528, the contact 1530, and the trace 1534.

It has been discovered that the integrated circuit packaging system 1500 further improves reliability. The resist material 1546 applied over the encapsulation 1624 and adjacent to the support terminal 1526 provides electrical insulation to prevent electrical shorts. The resist material 1546 also provides protection against oxidation and corrosion, thereby further improving the reliability.

Figure 17:
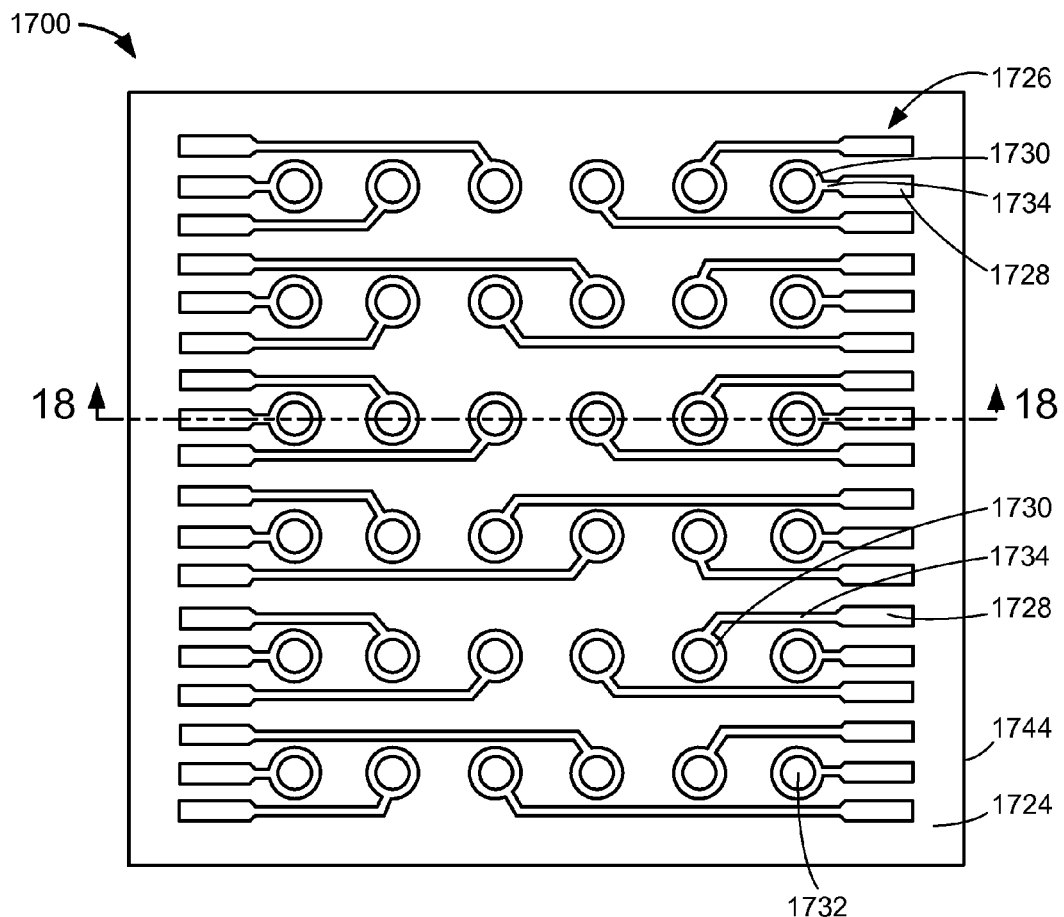
FIG. 17 is a top view of an integrated circuit packaging system in a ninth embodiment of the present invention.

Referring now to FIG. 17, therein is shown a top view of an integrated circuit packaging system 1700 in a ninth embodiment of the present invention. The integrated circuit packaging system 1700 can include an encapsulation 1724, defined as a cover of a semiconductor package that seals electrical components and provides mechanical and environmental protection.

The integrated circuit packaging system 1700 can include a support terminal 1726, defined as an interconnect having a conductive structure that provides physical support and electrical connectivity to external systems (not shown). The support terminal 1726 can include a lead 1728, defined as a portion of the support terminal 1726 that provides electrical connectivity to external systems. The lead 1728 can be more specifically a bond finger, a lead finger, or a contact pad.

For illustrative purposes, the lead 1728 is shown with a rectangular shape, although the lead 1728 can be formed in different shapes. For example, the lead 1728 can have a shape of a square, a triangle, a polygon, a parallelogram, or a rhombus.

The support terminal 1726 can include a contact 1730, defined as a portion of the support terminal 1726 that provides mounting support and electrical connectivity to external systems. For example, the contact 1730 can be a lead, a contact pad, or an electrical contact. Also for example, the contact 1730 can be a redistributed lead.

The contact 1730 can be formed in an area array adjacent to and between a number of the lead 1728. The contact 1730 can be connected to the lead 1728.

For illustrative purposes, the contact 1730 is shown in a full area array, although the contact 1730 can be formed in a different configuration. For example, the contact 1730 can be formed in a peripheral array adjacent to the lead 1728.

Also for illustrative purposes, the contact 1730 is shown with a circular shape, although the contact 1730 can be formed in different shapes. For example, the contact 1730 can have a shape of a square, a rectangle, a triangle, a polygon, a parallelogram, or a rhombus.

The contact 1730 can include a groove 1732, with which a support structure is provided to mount and attach external systems over the integrated circuit packaging system 1700. The groove 1732 can be more specifically a cavity or a recess. For example, the contact 1730 having the groove 1732 can provide a better contact to top package bumps that are mounted on the contact 1730.

For illustrative purposes, the groove 1732 is shown having a circular or curve shape, although the groove 1732 can be formed with a different shape. For example, the groove 1732 can a shape of a square, a rectangle, a triangle, a polygon, a parallelogram, or a rhombus.

The support terminal 1726 can include a trace 1734, defined as an electrical connection between the lead 1728 and the contact 1730. For example, the trace 1734 can be a signal trace or a wire.

The trace 1734 can be formed in different configurations. For example, the trace 1734 can be formed with different lengths. A length of the trace 1734 can be predetermined based on locations of the lead 1728 and the contact 1730, a distance between the lead 1728 and the contact 1730, a routing area that is used to form the trace 1734, or a combination thereof.

The lead 1728 can be formed in a row. For illustrative purposes, the lead 1728 is shown in two rows along non-horizontal sides 1744 of the encapsulation 1724, although the lead 1728 can be formed in a different configuration. For example, the lead 1728 can be formed in four rows along the non-horizontal sides 1744.

The lead 1728 can be formed at a distance from the non-horizontal sides 1744. The lead 1728 can be formed with a side at the distance from the non-horizontal sides 1744 and an opposite side connected to the trace 1734.

Figure 18:
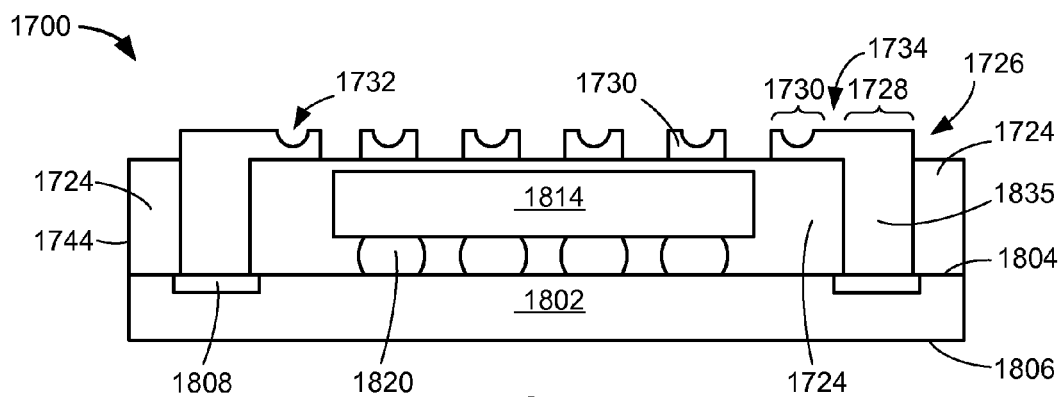
FIG. 18 is a cross-sectional view of the integrated circuit packaging system along a section line 18-18 of FIG. 17.

Referring now to FIG. 18, therein is shown a cross-sectional view of the integrated circuit packaging system 1700 along a section line 18-18 of FIG. 17. The integrated circuit packaging system 1700 can include a package carrier 1802. The package carrier 1802 is for mounting and connecting devices and integrated circuits as part of a finished product to be used in a system.

The package carrier 1802 can be more specifically a substrate. For example, the package carrier 1802 can be as a laminated substrate or a ceramic substrate.

The package carrier 1802 can have a first side 1804 and a second side 1806 opposite to the first side 1804. The package carrier 1802 can include a carrier pad 1808, more specifically a contact pad, a lead, or an electrical contact, at the first side 1804.

An integrated circuit 1814, more specifically a flip-chip, an integrated circuit die, a semiconductor device, or a chip, can be mounted over the first side 1804. An internal interconnect 1820, more specifically a ball, a bump, or an electrical connector, can be electrically connected to the first side 1804 and the integrated circuit 1814. The internal interconnect 1820 can be formed with solder, a metallic alloy, or a conductive material.

The encapsulation 1724 can be formed over the first side 1804 covering the integrated circuit 1814 and the internal interconnect 1820. The support terminal 1726 can include the lead 1728, the contact 1730 with the groove 1732 thereof, and the trace 1734. The groove 1732 can provide a support to mount and attach external systems over the contact 1730. The contact 1730 can be on the encapsulation 1724 and over the integrated circuit 1814.

The support terminal 1726 can include a vertical pillar 1835, defined as a conductive portion that provides electrical connectivity between horizontal planes of the integrated circuit packaging system 1700. The vertical pillar 1835 can be connected to the lead 1728.

The vertical pillar 1835 can be integral with the lead 1728, the contact 1730, and the trace 1734. In other words, the vertical pillar 1835, the lead 1728, the contact 1730, and the trace 1734 can be formed of a common material having characteristics being formed from a single integrated structure or a solid structure.

The vertical pillar 1835 can be mounted through the encapsulation 1724. The vertical pillar 1835 can be mounted on the carrier pad 1808. The vertical pillar 1835 can be formed with a vertical structure, which is perpendicularly to the contact 1730 and the trace 1734.

The vertical pillar 1835 can be adjacent to the non-horizontal sides 1744 of the encapsulation 1724. The vertical pillar 1835 can be at the distance from the non-horizontal sides 1744. The vertical pillar 1835 can be encapsulated or covered by the encapsulation 1724.

It has been discovered that the integrated circuit packaging system 1700 improves connectivity to external systems. The contact 1730, having the groove 1732, provides a secure structure for the external systems to mount thereto and attach thereon, thereby improving the connectivity to the external systems.

Figure 19:
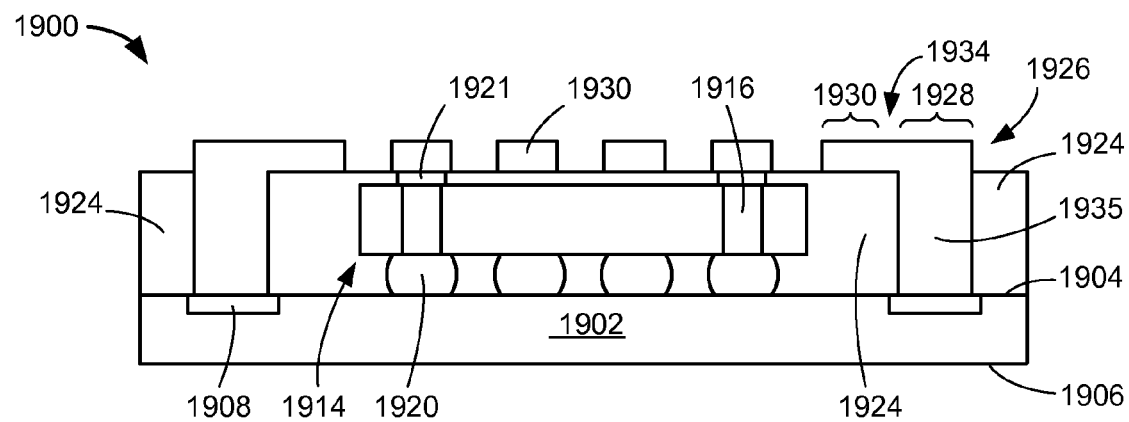
FIG. 19 is a cross-sectional view as exemplified by the top view of FIG. 1 of an integrated circuit packaging system in a tenth embodiment of the present invention.

Referring now to FIG. 19, therein is shown a cross-sectional view as exemplified by the top view of FIG. 1 of an integrated circuit packaging system 1900 in a tenth embodiment of the present invention. The integrated circuit packaging system 1900 can be formed in a manner similar to the integrated circuit packaging system 100 of FIG. 1, except for the formation of the integrated circuit 214 of FIG. 2.

The integrated circuit packaging system 1900 can include a package carrier 1902, having a first side 1904, a second side 1906, and a carrier pad 1908. The package carrier 1902 can be formed in a manner similar to the package carrier 202 of FIG. 2.

The integrated circuit packaging system 1900 can include an integrated circuit 1914. The integrated circuit 1914 can be formed in a manner similar to the integrated circuit 214, except that the integrated circuit 1914 can include a through silicon via 1916, defined as an electrical connection provided to connect the integrated circuit 1914 to external components.

The through silicon via 1916 can be more specifically an electrical channel formed with a conductive material. For example, the through silicon via 1916 can be formed with copper (Cu), a metal, or a metallic alloy.

The integrated circuit packaging system 1900 can include an internal interconnect 1920. The internal interconnect 1920 can be formed in a manner similar to the internal interconnect 220 of FIG. 2.

A second internal interconnect 1921, more specifically a stud, a pillar, a post, a ball, a bump, or a connector, can be formed on the integrated circuit 1914. The second internal interconnect 1921 can be electrically connected to the through silicon via 1916. The second internal interconnect 1921 can be formed with solder, a metal, an alloy, or a conductive material.

The integrated circuit packaging system 1900 can include an encapsulation 1924. The encapsulation 1924 can be formed in a manner similar to the encapsulation 124 of FIG. 1.

The encapsulation 1924 can cover a portion of the second internal interconnect 1921. The second internal interconnect 1921 can be partially exposed from the encapsulation 1924.

The integrated circuit packaging system 1900 can include a support terminal 1926 having a lead 1928, a contact 1930, and a trace 1934, and a vertical pillar 1935. The support terminal 1926 can be formed in a manner similar to the support terminal 126 of FIG. 1.

The contact 1930 can be mounted on the second internal interconnect 1921. The contact 1930 can be electrically connected to the second internal interconnect 1921. The contact 1930 connected to the through silicon via 1916 with the second internal interconnect 1921 can enable external components to directly communicate with the integrated circuit 1914.

Figure 20:
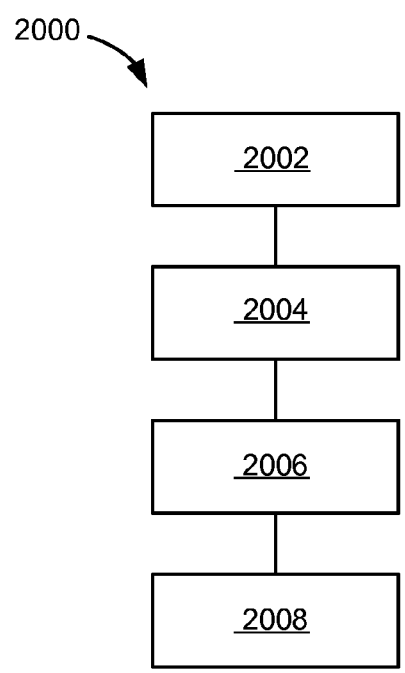
FIG. 20 is a flow chart of a method of manufacture of the integrated circuit packaging system in a further embodiment of the present invention.

Referring now to FIG. 20, therein is shown a flow chart of a method 2000 of manufacture of the integrated circuit packaging system 100 in a further embodiment of the present invention. The method 2000 includes: mounting an integrated circuit over a package carrier in a block 2002; pressing an encapsulation onto the package carrier and with the integrated circuit therein in a block 2004; mounting a conductive frame, having a vertical pillar integral with a horizontal cover, through the encapsulation, over the integrated circuit, and the vertical pillar on the package carrier and the horizontal cover on the encapsulation in a block 2006; and forming a contact from the horizontal cover in a block 2008.

The present invention can include an integrated circuit packaging system having a structure with any arrangements and types of components covered by an encapsulation and not limited to those included in embodiments previously described. In addition, external systems mounted on the integrated circuit packaging system can be any components with any arrangements.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An integrated circuit packaging system comprising:
   a package carrier;
   an integrated circuit over the package carrier;
   an encapsulation onto the package carrier and with the integrated circuit therein; and
   a support terminal, having a vertical pillar and a contact horizontally offset from the vertical pillar, wherein the vertical pillar extends through the encapsulation and onto the package carrier, wherein the contact resides on the encapsulation and over the integrated circuit, the contact having a groove with a curve shape, and wherein the groove, the contact and the vertical pillar are formed from a single structure.

2. The system as claimed in claim 1 wherein:
   the package carrier has a recess; and
   the integrated circuit is within the recess.

3. The system as claimed in claim 1 further comprising an underfill between the package carrier and the integrated circuit.

4. The system as claimed in claim 1 wherein:
   the package carrier has a carrier pad; and
   the support terminal, having the vertical pillar integral with the contact, the vertical pillar on the carrier pad.

5. The system as claimed in claim 4 further comprising a resist material over the encapsulation and adjacent to the contact.

6. The system as claimed in claim 4 wherein the integrated circuit has a through silicon via connected to the contact.

7. The system as claimed in claim 4 wherein the integrated circuit is a flip-chip over the package carrier.

* * * * *